(12) United States Patent
Barnard et al.

(10) Patent No.: US 11,698,308 B2
(45) Date of Patent: Jul. 11, 2023

(54) OPTICAL TEMPERATURE MEASUREMENTS IN PHOTONIC CIRCUITS

(71) Applicant: OpenLight Photonics, Inc., Goleta, CA (US)

(72) Inventors: Chris Barnard, Sunnyvale, CA (US); John Parker, Goleta, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 467 days.

(21) Appl. No.: 17/062,885

(22) Filed: Oct. 5, 2020

(65) Prior Publication Data

US 2022/0107229 A1    Apr. 7, 2022

(51) Int. Cl.
*G01K 11/12*     (2021.01)
*G01K 15/00*     (2006.01)
*G02B 6/12*      (2006.01)

(52) U.S. Cl.
CPC ............ *G01K 15/005* (2013.01); *G01K 11/12* (2013.01); *G02B 6/12004* (2013.01); *G02B 2006/12138* (2013.01); *G02B 2006/12142* (2013.01); *G02B 2006/12159* (2013.01)

(58) Field of Classification Search
CPC .. G01K 15/005; G01K 11/12; G02B 6/12004; G02B 2006/12138; G02B 2006/12142; G02B 2006/12159
USPC ........... 374/130, 131, 170, 178, 1, 2; 331/57
See application file for complete search history.

(56) References Cited

U.S. PATENT DOCUMENTS

| | | | | |
|---|---|---|---|---|
| 5,375,184 A | * | 12/1994 | Sullivan | G02B 6/43 385/129 |
| 6,275,317 B1 | * | 8/2001 | Doerr | H04B 10/505 398/201 |
| 10,527,784 B1 | | 1/2020 | Koste et al. | |
| 2017/0141536 A1 | * | 5/2017 | Fang | H01S 5/068 |
| 2017/0163000 A1 | * | 6/2017 | Evans | H01S 5/1028 |
| 2020/0018714 A1 | * | 1/2020 | Carr | H01J 49/025 |
| 2022/0373739 A1 | * | 11/2022 | Abril | H04B 10/25 |
| 2022/0397388 A1 | * | 12/2022 | Zhang | G01B 11/161 |
| 2023/0072335 A1 | * | 3/2023 | Dabich, II | G02B 6/3688 |

FOREIGN PATENT DOCUMENTS

| | | | | |
|---|---|---|---|---|
| CA | 2899044 A1 | * | 1/2016 | ........ G01D 5/35316 |
| EP | 3955035 A1 | * | 2/2022 | |
| WO | WO-9415235 A1 | * | 7/1994 | ............... G02B 6/10 |
| WO | WO-0138837 A1 | * | 5/2001 | ............... G01J 1/18 |
| WO | 2008042959 | | 4/2008 | |
| WO | 2016073506 | | 5/2016 | |

OTHER PUBLICATIONS

"European Application Serial No. 20216257.4, Extended European Search Report dated Jun. 21, 2021", 7 pgs.

* cited by examiner

*Primary Examiner* — Gail Kaplan Verbitsky

(74) *Attorney, Agent, or Firm* — Schwegman Lundberg & Woessner, P.A.

(57) ABSTRACT

Temperature measurements of photonic circuit components may be performed optically, exploiting a temperature-dependent spectral property of the photonic device to be monitored itself, or of a separate optical temperature sensor placed in its vicinity. By facilitating measurements of the temperature of the individual photonic devices rather than merely the photonic circuit at large, such optical temperature measurements can provide more accurate temperature information and help improve thermal design.

20 Claims, 9 Drawing Sheets

OPTICAL TEMPERATURE MEASUREMENTS IN PHOTONIC CIRCUITS

TECHNICAL FIELD

This disclosure relates to methods and sensors for temperature measurements in photonic integrated circuits (PICs).

BACKGROUND

Many photonic circuit components, including, e.g., lasers and optical modulators, are highly temperature-sensitive in their performance. An important aspect of photonic-circuit design is, therefore, the thermal design of the PIC, which specifies the layout of heat sources (including heat-generating photonic devices) and heat spreaders and sinks, with the goal to optimize the range of ambient temperatures at which the PIC will operate reliably. Thermal design and validation rely on accurate temperature measurements. Since the temperature can vary widely across the PIC, however, temperature measurements of the PIC as a whole are often inadequate. On the other hand, temperature measurements of the individual PIC elements, while desirable for purposes of thermal design, can be difficult because thermal sensor placement near the relevant photonic components is often hindered by spatial constraints and/or the potential for electrical interference of the thermal sensor (such as, e.g., a resistance temperature sensor (RTD) with the photonic component.

DESCRIPTION

Figure 1:
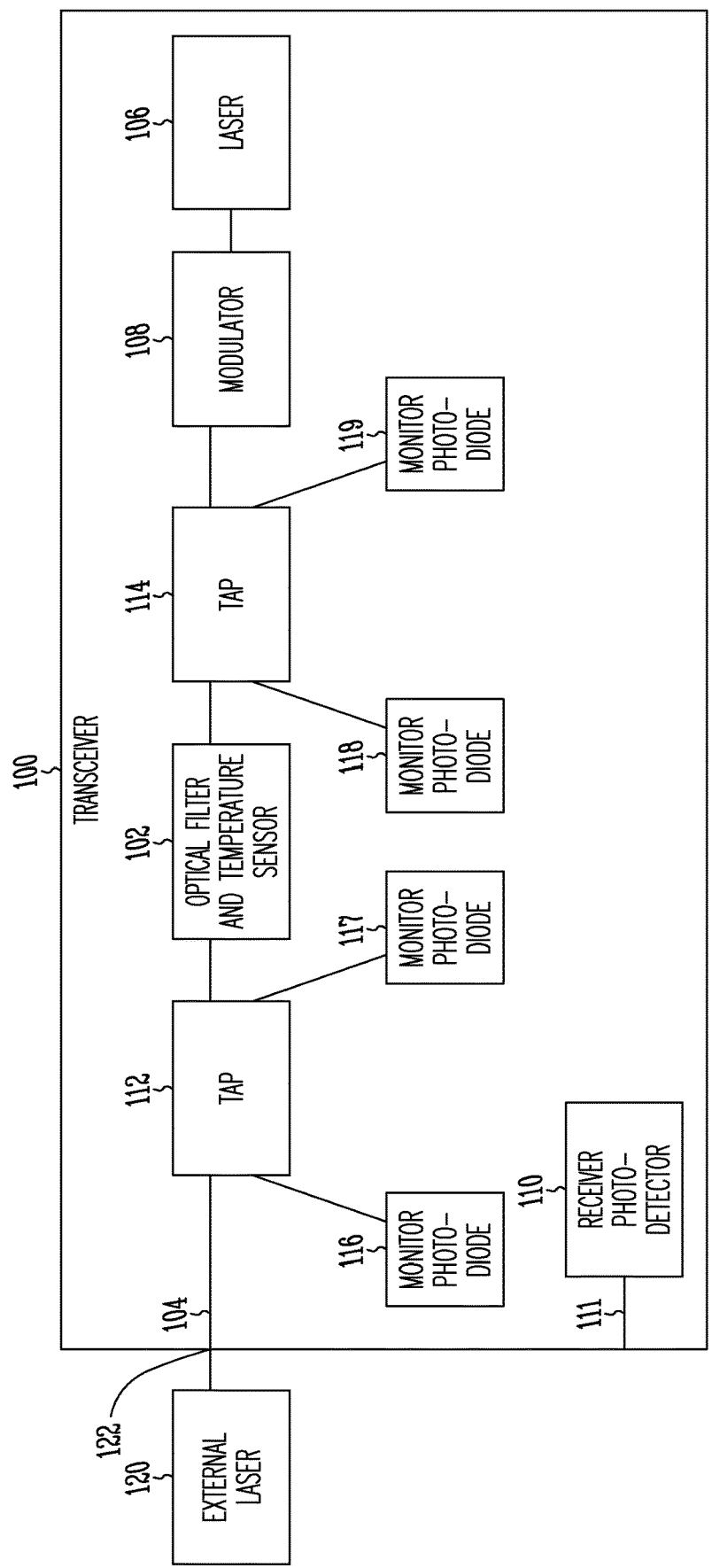
FIG. 1 is a schematic block diagram of an example photonic transceiver configured to enable optical temperature measurements with an integrated optical filter, in accordance with various embodiments.

Disclosed herein are various approaches to measuring the temperature of photonic circuit components optically, rather than using RTDs or other conventional, electronic temperature sensors. In some embodiments, photonic devices that fulfill various mission-mode function, such as, e.g., multiplexing/demultiplexing or modulating light, are calibrated and selectively operated during use to double as temperature sensors. For example, the temperature-dependent spectral shift in optical filters such as Mach-Zehnder interferometers (MZIs) or asymmetric MZIs (AMZIs), arrayed waveguide gratings (AWGs), or in electro-absorption modulators (EAMs), can be exploited to measure the temperature of these components. In other embodiments, the PIC is enhanced with optical components that have no mission-mode function, but serve solely to determine the temperature based on a temperature-dependent change in their optical (e.g., spectral) properties. Beneficially, such optical temperature sensors can be placed in very close proximity to diode junctions in lasers, modulators, photodetectors, etc., without interfering electrically. Furthermore, in hybrid platforms that use compound semiconductor (e.g., III-V) active devices on a silicon device layer including waveguides and other optically passive components, optical temperature sensors can be implemented in the silicon device layer underneath the active devices whose temperature is to be measured, circumventing spatial constraints that exist in the compound semiconductor layer.

To appreciate the benefits afforded by measuring the temperature of individual photonic components, rather than of the photonic circuit at large, consider, for example, an optical transceiver including four lasers. Assume that the temperature across the lasers varies by twenty degrees at the maximum operating current, e.g., due to thermal cross-talk from other, nearby heat sources, such as optical components within the PIC or electronic components within an adjacent electronic integrated circuit (EIC). The hottest of the lasers may have a significantly (e.g., three times) shorter operating lifetime than the coolest of the lasers, and may further suffer from instability (e.g., leading to mode-hopping) and output lower optical power. Laser instability and reduced output power do, however, not necessarily indicate a hotspot, but may also be due to laser damage caused during PIC fabrication or assembly or due to deficiencies in the optical design. It is important, therefore, to separate temperature effects from laser damage and/or optical design issues. Using optical temperature measurements as described herein, the temperatures at the junctions of all four lasers can be measured individually, and more accurately than using electronic temperature measurements, which facilitates identifying the hotspot, and then modifying the thermal design (including, e.g., the heat spreader, spacing of components within and adjacent the PIC die, etc.) to reduce the hotspot temperature.

Various example embodiments of devices, systems, and methods for optical temperature measurements in PICs will in the following be described with reference to the accompanying drawings.

FIG. 1 is a schematic block diagram of an example photonic transceiver 100 configured to enable optical temperature measurements with an integrated optical filter 102, in accordance with various embodiments. The photonic transceiver 100 includes, along a transmitter path 104, a laser 106 to generate an optical carrier signal, an optical modulator 108 to impart data onto the optical carrier signal via amplitude modulation, and the optical filter 102, which functions as a wavelength reference for the laser 106. Further, the photonic transceiver 100 includes a photodetector 110 and associated receiver path 111 serving as an optical receiver. In addition, to facilitate temperature measurements with the optical filter 102, the transceiver 100 includes optical taps 112, 114 bracketing the optical filter 102, each splitting off a fixed fraction of the light (e.g., 5%) and having two outputs directing the split-off light to two respective monitor photodiodes 116, 117 and 118, 119 that allow measuring the optical power entering and exiting the optical filter 102 in either direction of light propagation in the transmitter path 104. The photonic transceiver 100 may be implemented, e.g., in a hybrid material platform comprising compound-semiconductor (e.g., III-V) active device components of the laser 106, modulator 108, receiver photodetector 110, and monitor photodiodes 116, 117, 118, 119 coupled to waveguides (implementing, e.g., the transmitter path 104 and receiver path 111) and other passive devices or device components formed in a silicon device layer (e.g., of a silicon-on-insulator (SOI) substrate).

The optical filter 102 may be implemented, e.g., as an AMZI, which is characterized by an optical path-length difference between two interferometer arms that produces an interference signal whose intensity varies periodically with the frequency of the light. The period of that variation is the free spectral range (FSR) of the filter 102. The AMZI (or other optical filter 102) is calibrated to achieve a specified transmission, measured as the ratio of output optical power to input optical power, at a specified reference wavelength. When the wavelength of the laser 106 deviates from the reference wavelength, this deviation will manifest itself in a change of the transmission of the filter 102 (as determined from the input and output optical powers measured by photodiodes 118, 116, respectively), providing for feedback to tune the laser 106 to the reference wavelength. However, the transmission spectrum of the filter 102 is generally temperature-dependent, and the temperature of the filter 102 can vary in mission-mode use, e.g., due to heat emanating from the laser 106. It is desirable to design the photonic circuit to minimize any such heating. Even if the temperature of the filter 102 is monitored during use and discrepancies from the temperature at the time of calibrating the filter as a wavelength reference are actively compensated for, e.g., using an integrated heater or thermo-electric cooler, it is desirable to minimize the power requirements of such active heat adjustments.

In accordance with various embodiments, the optical filter 102 is used as its own temperature sensor during thermal design of the transceiver 100. For this purpose, an external laser 120 couples light into the optical filter 102, e.g., via a transmitter output port 122 (which serves, in mission mode, to transmit the modulated optical signal), and the transmission and/or output optical power of the filter 102 (in a direction of propagation of the light coming from the external laser 120) is measured. In some embodiments, the external laser 120 is a tunable laser source that is stepped over a range of wavelengths, e.g., including one or more FSRs of the filter 102, to identify the wavelength at which the transmission reaches a peak (maximum) or null (minimum) via measurements of the relative optical output power at the monitor photodiode 119 following the filter 102. Based on the known temperature dependence of the peak or null wavelength as determined by calibration, the measured peak or null wavelength can then be converted to the measured temperature of the optical filter 102. In alternative embodiments, the external laser 120 is operated at a single specified wavelength, and the transmission of the optical filter 102 at that wavelength is measured using the monitor photodiodes 117, 119 preceding and following the filter 102. Based on the known temperature dependence of the filter transmission at the selected wavelength of the external laser 120, the temperature of the filter 102 can then be calculated from the measured transmission.

To study effect of other transceiver components on the temperature of the optical filter 102, thermal design involves operating the transceiver 100 in mission mode, with the transceiver laser 106 at full mission-mode power. Thus, as the optical filter 102 is optically interrogated by an optical signal from the external laser 120, it simultaneously receives an optical signal from the transceiver laser 106. The two optical signals propagate in opposite directions, such that measurement of the transmitted portion of the external laser signal is unaffected by the signal from the transceiver laser 106. The external laser 120 may include an optical isolator that prevents damage due to light received from the transceiver laser 106. Conversely, light from the external laser 120 reaching the transceiver laser 106 can somewhat degrade the optical performance of the latter during the measurement of the filter temperature, but that is generally not an issue during the design phase. Note that, with suitable enhancements to the transceiver 100 (e.g., an isolator protecting the modulator 108 and laser 106 from light injected into the transmitter path 104 by the external laser 120), or by using an external laser wavelength far detuned from the transceiver operating wavelength, it is in principle also possible to use the optical filter 102 to monitor its own temperature during ordinary mission-mode through-out the lifetime of the transceiver.

While FIG. 1 shows only a single lane of the photonic transceiver 100, it will be readily apparent to those of ordinary skill in the art that a multiple-lane transceiver can be implemented by replicating the transmitter and receiver components. The temperature of the optical filter 102 in each lane can then be measured in the same manner as described above, coupling the external laser 120 sequentially (or multiple external lasers simultaneously) into the various transmitter paths.

Figure 2:
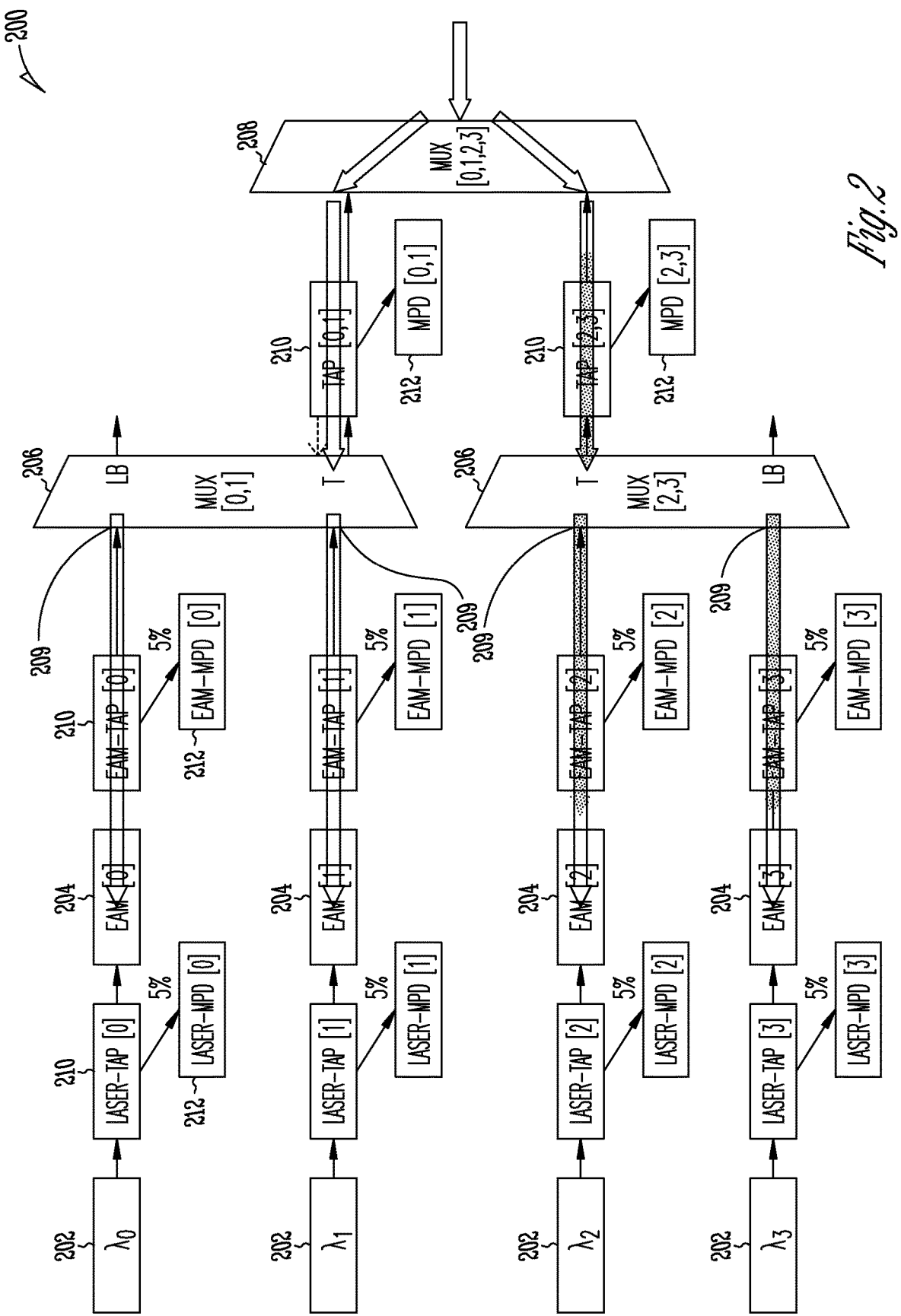
FIG. 2 is a schematic block diagram of an example photonic transceiver configured to enable optical temperature measurements with an integrated multiplexer, in accordance with various embodiments.

To provide another example of temperature measurements with photonic devices that possess a separate mission-mode function, FIG. 2 is a schematic block diagram of an example photonic transceiver 200 configured to enable optical temperature measurements with an integrated multiplexer, in accordance with various embodiments. The transceiver 200 includes four lanes, each including a laser 202 and associated EAMs 204 to impart data onto the optical carrier signal. The lasers 202 emit light at four different wavelengths $\lambda_0$, $\lambda_1$, $\lambda_2$, and $\lambda_3$, and the modulated optical signals at the four wavelengths are multiplexed in two stages into a combined optical transceiver output signal. The laser wavelengths may be evenly spaced, e.g., at $\lambda_0 \approx 1295$ nm, $\lambda_1 \approx 1300$ nm, $\lambda_2 \approx 1305$ nm, and $\lambda_3 \approx 1310$ nm. The components whose temperatures are to be measured are, in this example, the multiplexers 206 at the first stage, which multiplex $\lambda_0$, $\lambda_1$ and $\lambda_2$, $\lambda_3$, respectively, into two partially multiplexed signals provided as input to the second-stage multiplexer 208. The multiplexers 206 (as well as 208) may be implemented, for example, as AMZIs each with two input ports 209 and one common output port (in the direction of propagation of light from the transceiver lasers 202).

To measure the temperature of the first-stage multiplexers 206, they are interrogated with an external tunable laser (not shown) that is coupled into the transceiver via the transmitter output port and the second-stage multiplexer 208 (where the output port of the multiplexer may also constitute the transmitter output port) and propagates in a direction opposite to that of the optical signals emitted by the transceiver lasers 202. The external laser is swept over a wavelength range to determine the spectral transmission peak of light output at one or both input ports 209 (corresponding to output ports in the direction of propagation of the external laser signal) of the multiplexers 206. If the multiplexers 206 are at their target operating temperatures, these transmission peaks will occur at $\lambda_0$, $\lambda_1$, $\lambda_2$, and $\lambda_3$. Any deviation from the target operating temperature will generally cause a shift of the peaks to shorter or longer wavelengths (depending on whether the temperature is above or below the target operating temperature). Note that, although the transceiver 200 includes taps 210 and associated monitor photodiodes 212 at various inputs and outputs between the transceiver lasers 202, EAMs 204, and multiplexers 206, 208, those taps 210 are configured to only measure light going in the direction from the transceiver lasers 202 to the transmitter output port, and can therefore not be used to measure the transmitted portions, at the multiplexers 206, of the external laser signal. Instead of configuring the taps 210 and adding monitor photodiodes 212 to measure the light from the external laser in the circuit, as is done in the transceiver 100 of FIG. 1 and can in principle be implemented in transceiver 200 as well, the depicted embodiment uses the EAMs 204 to measure the optical power of the external laser signal transmitted by the multiplexers 206. The EAMs 204 are operated at a high voltage bias, which causes high photo-absorption, and the photocurrent generated by the EAMs is proportional to the optical power of the measured signal.

Figure 3A:
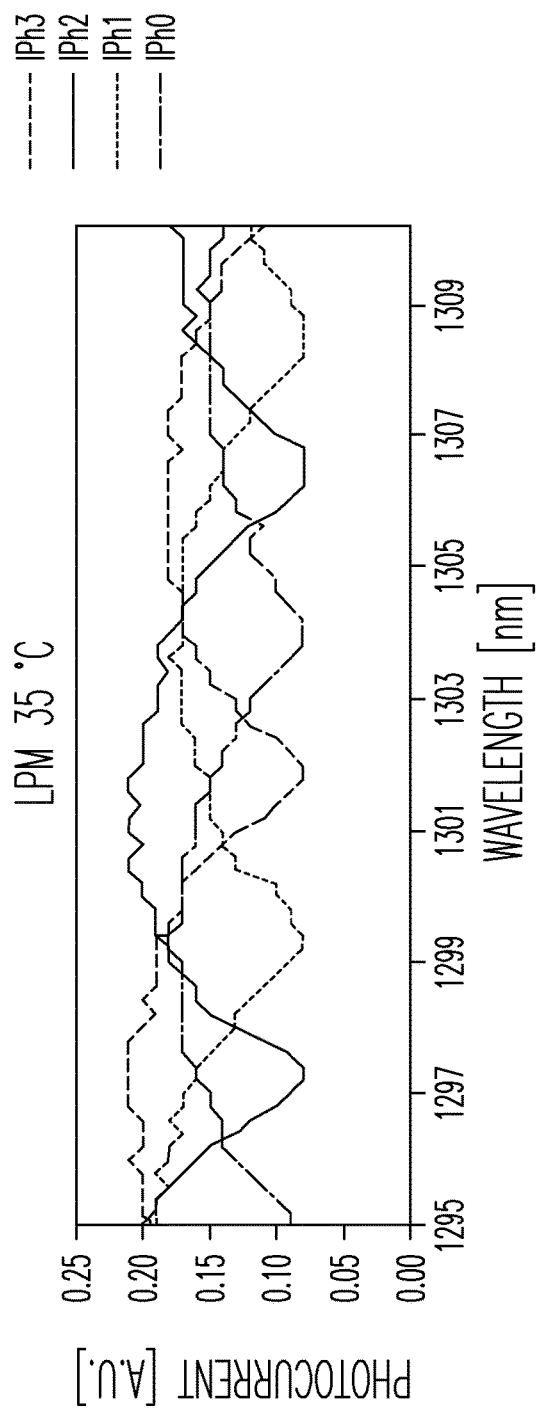
FIGS. 3A-3C show graphs of example spectral responses of the multiplexers of transceiver of FIG. 2, operated in low-power mode, as measured over two spectral ranges at receiver case temperatures of 35° C., 70° C., and 80° C., respectively, in accordance with various embodiments.
Figure 3B:
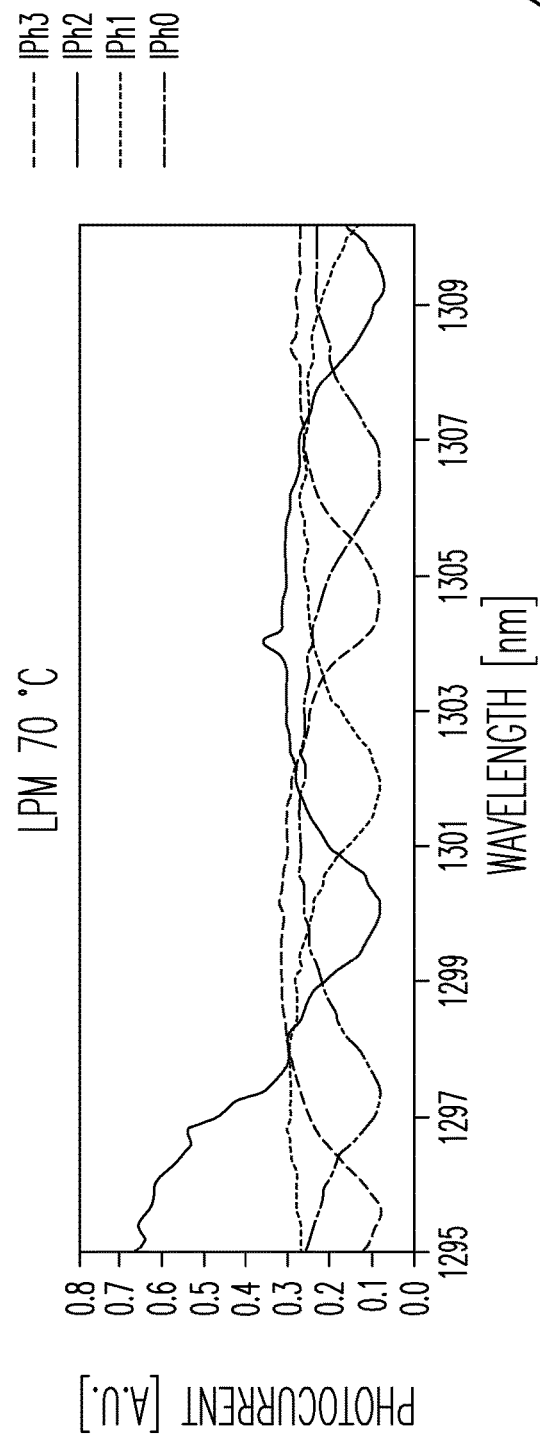
Figure 3C:
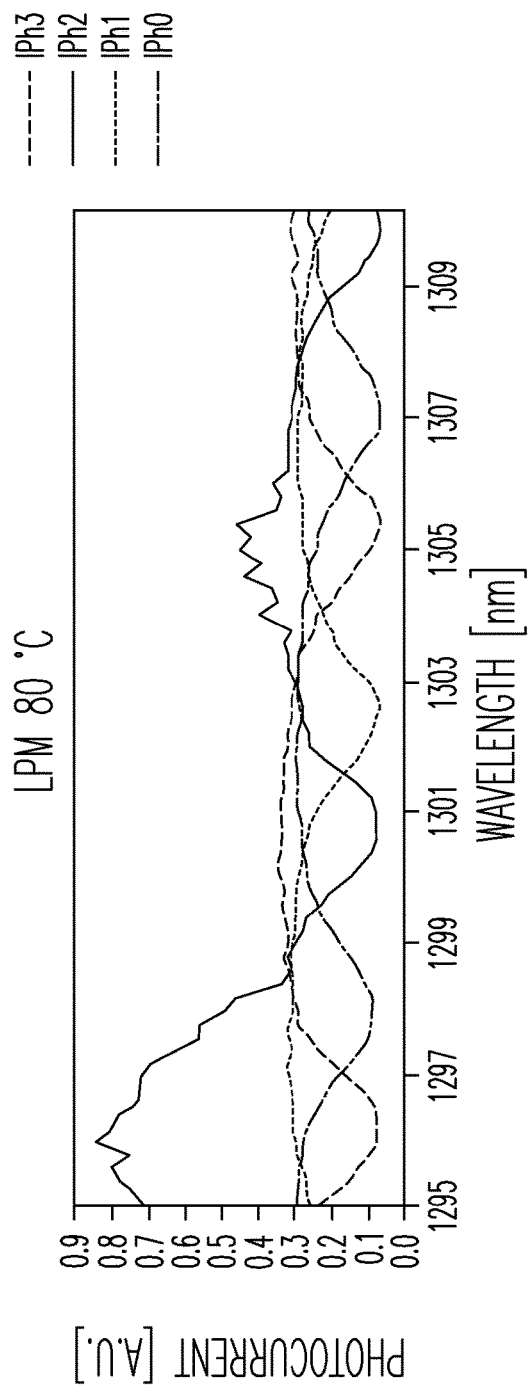

FIGS. 3A-3C show graphs of example spectral responses of the multiplexers of transceiver 200 of FIG. 2, operated in low-power mode ("LPM"), as measured over two spectral ranges at receiver case temperatures of 35° C., 70° C., and 80° C., respectively, in accordance with various embodiments. In low-power mode, power is sufficient to operate and read the EAMs 204, but the transceiver lasers 202 and other components are turned off. It is assumed that the self-heating of the transceiver 200 in low-power mode is negligible, and that the transceiver 200 had time to equilibrate, such that the multiplexer temperature is close to the receiver case temperature. The four graphs in each figure show the photocurrents ("IPh") at the EAMs 204 resulting from measurement of the optical power output at the input ports 209 of the multiplexers 206. As can be seen, the transmission peaks and nulls of the four optical signals, as reflected in the photocurrents, are approximately evenly distributed over an FSR (mirroring, as is to be expected, the uniform spacing of the laser wavelengths of the transceiver lasers 202). Comparing the graphs at 35° C. (FIG. 3A), 70° C. (FIG. 3B), and 80° C. (FIG. 3C), a shift of the spectral responses towards longer wavelengths can be observed. For example, the transmission minimum of the signal measured at the multiplexer input port 209 associated with $\lambda_2$ shifts from about 1297.5 nm at 35° C. to about 1300 nm at 70° C. and almost 1301 nm at 80° C.

Figure 3D:
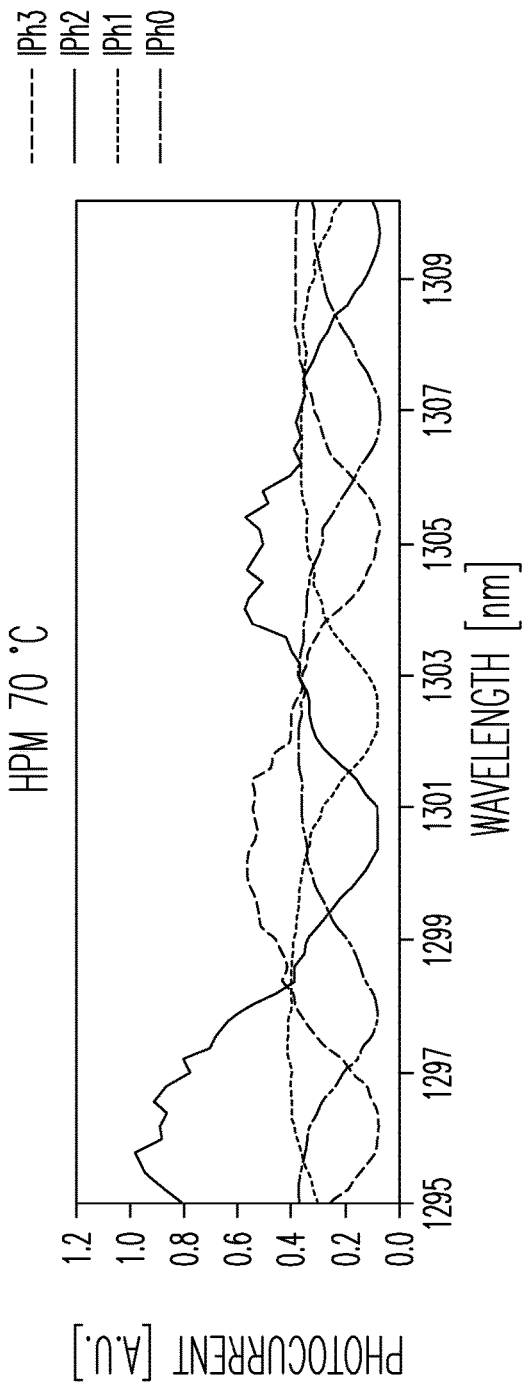
FIG. 3D shows graphs of example spectral responses of the multiplexers of transceiver of FIG. 2, operated in high-power mode, as measured at a receiver case temperature of 70° C., in accordance with various embodiments.

FIG. 3D shows graphs of example spectral responses of the multiplexers of transceiver 200 of FIG. 2, operated in high-power mode ("HPM"), as measured at a receiver case temperature of 70° C., in accordance with various embodiments. In high-power mode, the transceiver lasers 202 are turned on, and tend to heat up other transceiver components, including the multiplexers 206. It is to be expected, therefore, that the local temperature of the multiplexers 206 is higher than the ambient temperature. Indeed, comparing the signal measured at the multiplexer input port 209 associated with $\lambda_2$ in high-power mode with that measured in low-power mode at the same receiver case temperature of 70° C. (FIG. 3B), it can be seen that the transmission minimum has shifted to almost 1301 nm, indicating that the temperature of the multiplexer 206 is about 80° C.

The described approach to optical temperature measurements of photonic devices using those same device as sensors, illustrated above with the examples of a wavelength reference and demultiplexers, is generally applicable to any photonic device that features, and is amenable to measurement of, some temperature-dependent spectral property. Such properties may include, for example, spectral features, like the wavelengths or amplitudes of peaks and nulls, of optical transmission, reflection, or absorption spectra, as well as transmission, reflection, or absorption levels at a given wavelength. Photonic devices suited to optical interrogation for temperature measurements include devices based on, for instance, symmetric or asymmetric MZIs, AWGs, or EAMs, as may fulfil mission-mode functions of, e.g., optical filters, multiplexers/demultiplexers, or modulators.

Various modifications to the above approach may be made. For example, while the interrogation of the phonic device of interest will in practice often utilize a laser external to the PIC, it is in principle also possible to use an internal laser (e.g., with its output signal routed to propagate in an opposite direction to the light used for the mission-mode function of the photonic device). The internal laser, to be suitable for temperature monitoring, may be low-power to prevent self-heating, and may be calibrated at two or more temperatures using an external wavelength monitor such as an optical spectrum analyzer (OSA). Alternatively, the internal laser may be placed in a relatively temperature-stable portion of the PIC (e.g., a low-power-density region) while it monitors a hot spot on the other side of PIC (e.g., in a high-power-density region). Further, while the above-described example embodiments use photodetectors integrated into the PIC, it is also possible to route the optical signal that is to be measured for temperature-determination purposes off-chip for detection by external photodetectors. External photodetectors may be used, e.g., when the spectral property of the photonic device is measured in reflection rather than transmission mode.

Figure 4:
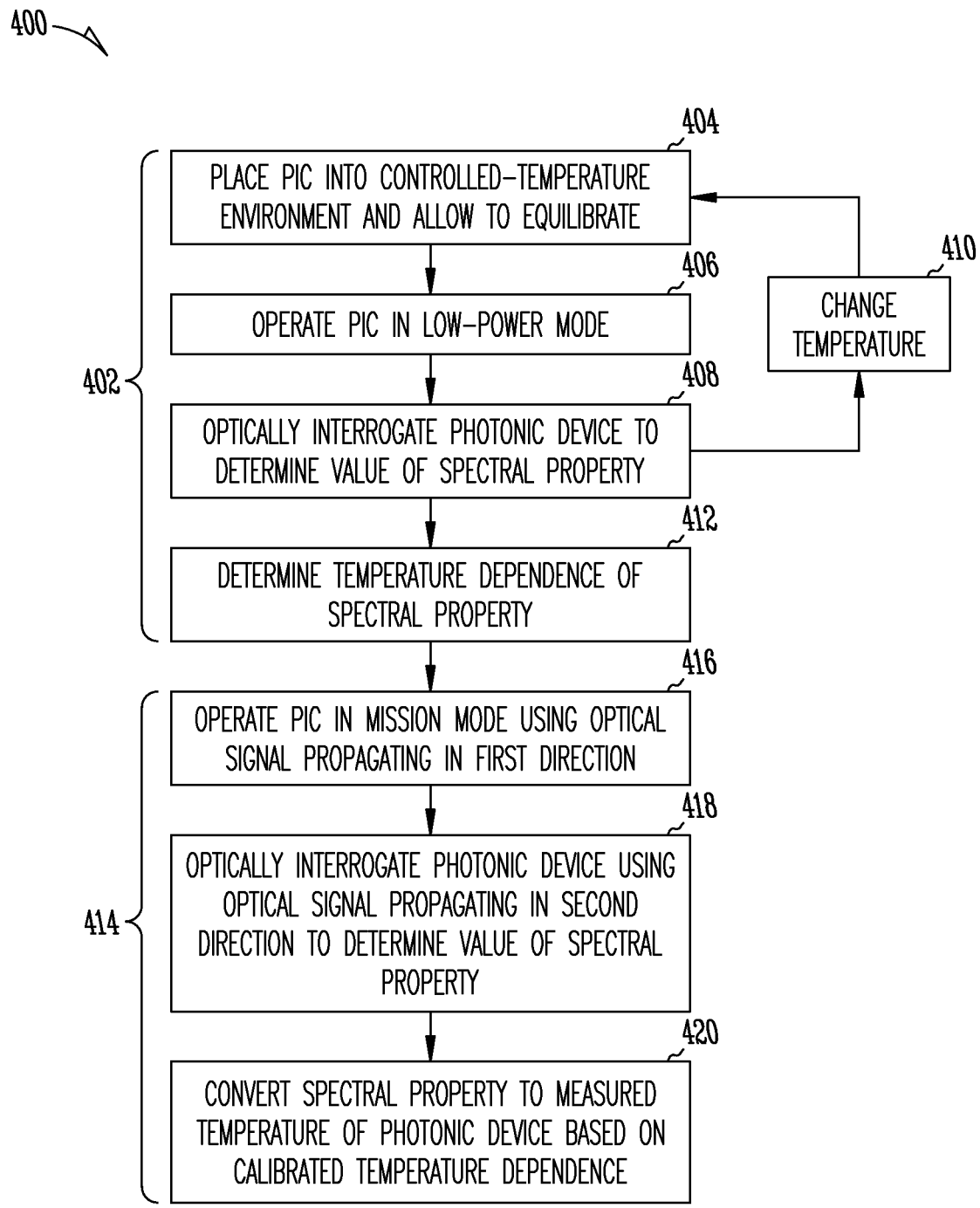
FIG. 4 is a flow chart of a method of calibrating and operating a photonic device with separate mission-mode function for optical temperature measurements, in accordance with various embodiments.

FIG. 4 is a flow chart of a method 400 of calibrating and operating a photonic device with separate mission-mode function for optical temperature measurements, in accordance with various embodiments. During a calibration phase 402, the PIC including the photonic device (e.g., a photonic transceiver PIC) is placed into a controlled-temperature environment (such as, e.g., an oven) set to an initial temperature, and allowed to thermally equilibrate, e.g., for about an hour (act 404). After sufficient time has passed, it can be assumed that the entire PIC, including the photonic device of interest, is substantially at the set temperature (e.g., within a few degrees Kelvin, or generally some acceptable margin of deviation for the given application, which will affect the equilibration time). If integrated photodetectors are to be used for the calibration, the PIC is then turned on and operated in a low-power mode, sufficient to use the integrated photodetectors, but avoiding other power consumption to minimize heating (act 406). In this state, the photonic device is optically interrogated to determine a spectral property of the photonic device (act 408). Usually (although not necessarily), light for this purpose is coupled into the photonic device from an external laser source. For example, to measure the transmission spectrum of an optical modulator, multiplexer, or wavelength reference, in the transmitter path of a photonic transceiver, an optical signal from an external laser may be coupled into the photonic device via the transmitter path, in a direction or propagation that is opposite to the direction of propagation of the mission-mode optical signal from the PIC laser. The wavelength of the external laser may be stepped over a wavelength range including, typically, one or more FSRs of the photonic device, and the wavelength at the null and/or peak of the thus measured spectral response are recorded.

The controlled-temperature environment is then changed to a second temperature (act 410), the PIC is allowed to thermally equilibrate at the second temperature (act 404), and the interrogation of the photonic device to measure the spectral property during low-power mode is repeated at the second temperature (act 408). Optionally, the spectral property is measured at one or more additional temperatures, depending on the desired accuracy of the thermal characterization, as well as cost and time considerations. For example, in some embodiments, the calibration (phase 402) is performed only once on one part and thereafter applied to many parts; in this case, it may be feasible to measure at several or tens of temperatures. On the other hand, if the calibration is performed per part, it may rely on merely two measurements, e.g., taken at two temperatures that cause a relative shift in the spectral property of less than the FSR.

The determined values of the spectral property at two or more temperatures are then used to determine the temperature dependence of the spectral property over a continuous range of temperatures, which may involve interpolating between and/or extrapolating beyond the temperatures at which the measurements were performed (act 412). For example, based on measurements of the transmission peak or null wavelengths $\lambda_1$ and $\lambda_2$ at two respective temperatures $T_1$ and $T_2$, the temperature-dependent wavelength shift can be calculated as $d\lambda/dT=(\lambda_2-\lambda_1)/(T_2-T_1)$. The determined temperature dependence is stored in memory for later use. In some embodiments, the temperature dependence is stored in memory of an EIC associated with the PIC, e.g., the EIC providing control signals and data readout for a transceiver PIC, where the temperature dependence of the transceiver component of interest may be stored along with other calibration data, such as target bias and modulation settings, etc. However, storage of the calibrated temperature dependence of the spectral property is also possible.

Once the calibration phase 402 has been completed, the calibration data can be used to measure the temperature of the photonic device as part of characterizing the mission-mode thermal performance of the PIC in phase 414. The PIC is now operated in mission mode, that is, powered on as in mission mode (which is generally a high-power mode), and with a mission-mode optical signal, e.g., from an internal PIC laser (such as a transceiver laser), coupled into the photonic device in one direction (act 416). To measure the spectral property of the photonic device, the device is interrogated with an interrogation signal propagating in the other direction, e.g., coupled into the PIC by an external laser (act 418). Using the stored, calibrated temperature dependence of the spectral property, the measured spectral property can then be converted to a temperature of the device (act 420). Continuing the above example of transmission wavelength measurements, a transmission peak or null wavelength of l measured during mission mode may be converted into the temperature of the photonic device according to: $T=T_1+(\lambda-\lambda_1)/(d\lambda/dT)$.

The foregoing examples all illustrate embodiments in which the photonic device whose temperature is to be measured doubles as its own temperature sensor. In various alternative embodiments, the PIC instead includes one or more dedicated optical temperature sensors, that is, added components that do not fulfill any independent mission-mode function. Each such dedicated temperature sensor is placed in "sensing proximity" to the photonic devices whose temperature is to monitored, meaning that the temperature sensor is physically close enough to the location in the photonic device where the temperature is of interest to be at substantially the same temperature (e.g., within a few degrees K). In various embodiments, the photonic device to be monitored is an optically active device including a diode junction, and the temperature at that junction is to be measured. In some embodiments, the temperature sensor is within sensing proximity from the location of interest, such as the diode junction in the active photonic device, if it is less than 10 μm, preferably less than 3 μm away from that location.

Figure 5:
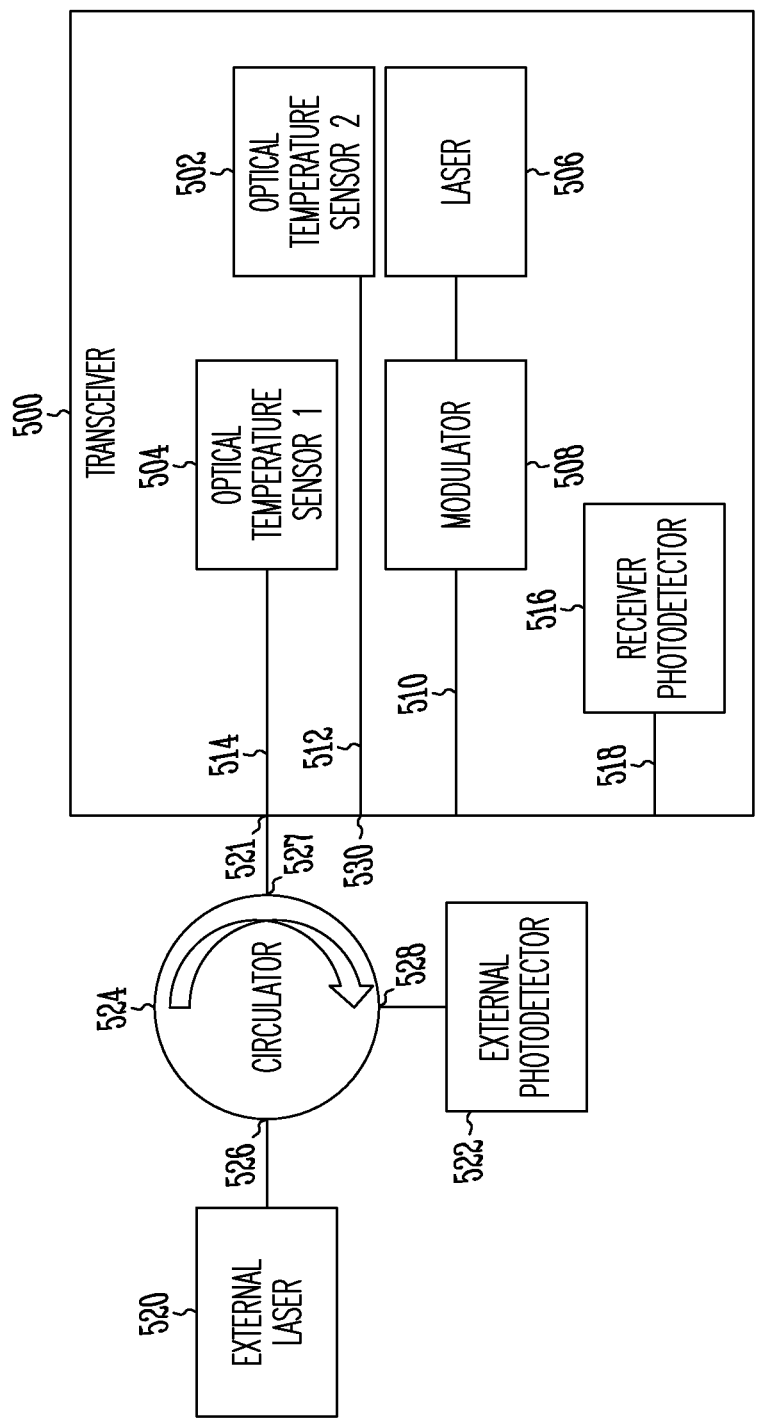
FIG. 5 is a schematic block diagram of an example photonic transceiver equipped with added optical temperature sensors near the laser and modulator, in accordance with various embodiments.

FIG. 5 is a schematic block diagram of an example photonic transceiver 500 equipped with added optical temperature sensors 502, 504 near the laser 506 and modulator 508, in accordance with various embodiments. Here, the laser 506 and modulator 508 are coupled to a first optical waveguide 510, which implements the transmission path, whereas the optical temperature sensors 502, 504 are placed within, or coupled to, respective second and third optical waveguides 512, 514 that are separate from the first waveguide 510. The photodetector 516 of the receive is coupled to a fourth optical waveguide 518, which implements the receiver path (as usual). All four waveguides 510, 512, 514, 518 have their own respective input/output ports.

As in transceiver 100 of FIG. 1, the laser 506 and modulator 508 of the transmitter, and the photodetector 516 of the receiver, may be implemented in a compound-semiconductor-on-silicon hybrid platform, with waveguides in the silicon device layer coupled to optically active regions formed in a the compound semiconductor (e.g., III-V) layer thereabove. The active photonic devices may, for instance, be or include a III-V p-i-n diode structure with electrical connections to the p-type and n-type layers to apply a voltage across the diode structure, forming a diode junction in the intrinsic, active layer, as is known in the art. The temperature of this diode junction significantly affects the optical performance of the respective device, and is therefore important to monitor. With electronic temperature sensor implementations, placing the sensor too close to the diode junction risks causing electrical interference. The optical temperature sensors 502, 504, on the other hand, do not pose this problem, and can, thus, be placed much closer, facilitating more accurate temperature measurements. For example, in some embodiments, the optical sensors 502, 504 are as close as about 1 μm to the diode junction.

Similarly to photonic devices with mission-mode function doubling as temperature sensors, the optical temperature sensors 502, 504 generally exploit a temperature-dependent spectral property, such as a transmission or reflection peak or null, or a transmission or reflection level at a specified wavelength, for temperature measurements. Examples of photonic devices useful as temperature sensors 502, 504 include Bragg gratings, ring resonators, and AMZIs, all of which can be implemented as passive optical components, without any need for electrical connections. The optical temperature sensors 502, 504 may be interrogated using an external laser 520 and an external photodetector 522 or integrated photodetector. For example, as shown, an interrogation signal generated by the external laser 520 may be coupled at the input/output port 521 of the optical waveguide 512 into the optical waveguide 512 to propagate to the optical temperature sensor 504 associated with the modulator 508 of the transceiver 500, and light reflected by the temperature sensor 504 may return to the input/output port 521 of the waveguide 512 and be coupled to an external photodetector 522. A three-port optical circulator 524 may serve to direct light received at a first circulator port 526 via a second circulator port 527 into the waveguide 512, and to directed reflected light received at the second circulator port 527 via a third circulator port 528 to the photodetector 522. As will be readily appreciated, the interrogation apparatus formed collectively by the external laser 520, circulator 524, and external photodetector 522 can be moved to the input/output port 530 of the optical waveguide 514 associated the optical temperature sensor 502 at the transceiver laser 506, and that temperature sensor 502 can then be interrogated analogously.

Instead of measuring the reflected portion of the interrogation signal, its is also possible to measure the transmitted portion. The transceiver 500 would, in this case, be modified to extend the waveguide 512 (or 514) past the temperature sensor 504 (or 502) to an integrated photodetector or to a second input/output port of the waveguide 512 (or 514) for measuring the light with an external photodetector. Whether external or integrated photodetectors are used will generally depend on practical considerations in the particular application. The use of integrated photodetectors is beneficial in that it reduces the interrogation apparatus to simply the external laser, and facilitates streamlining temperature measurements by integrating read-out of the temperature sensor in the EIC associated with the PIC, which may also include memory storing the calibration data for the sensor. These benefits, however, come at the cost of increased manufacturing complexity and chip area associated with the temperature sensor.

Figure 6A:
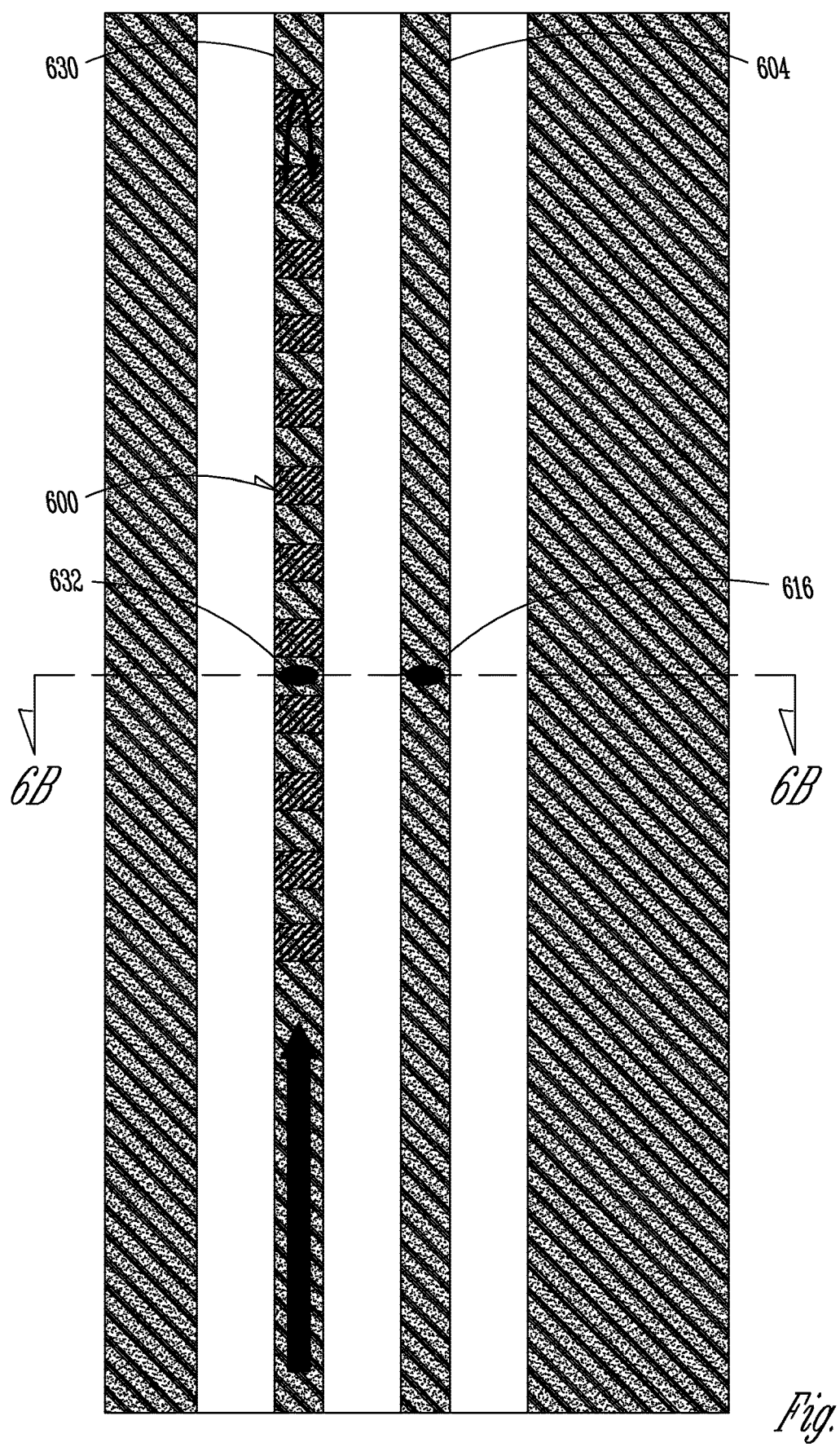
FIGS. 6A and 6B are top and cross-sectional side views, respectively, of a Bragg-grating-based optical temperature sensor placed adjacent a compound semiconductor laser of a PIC, in accordance with various embodiments.
Figure 6B:
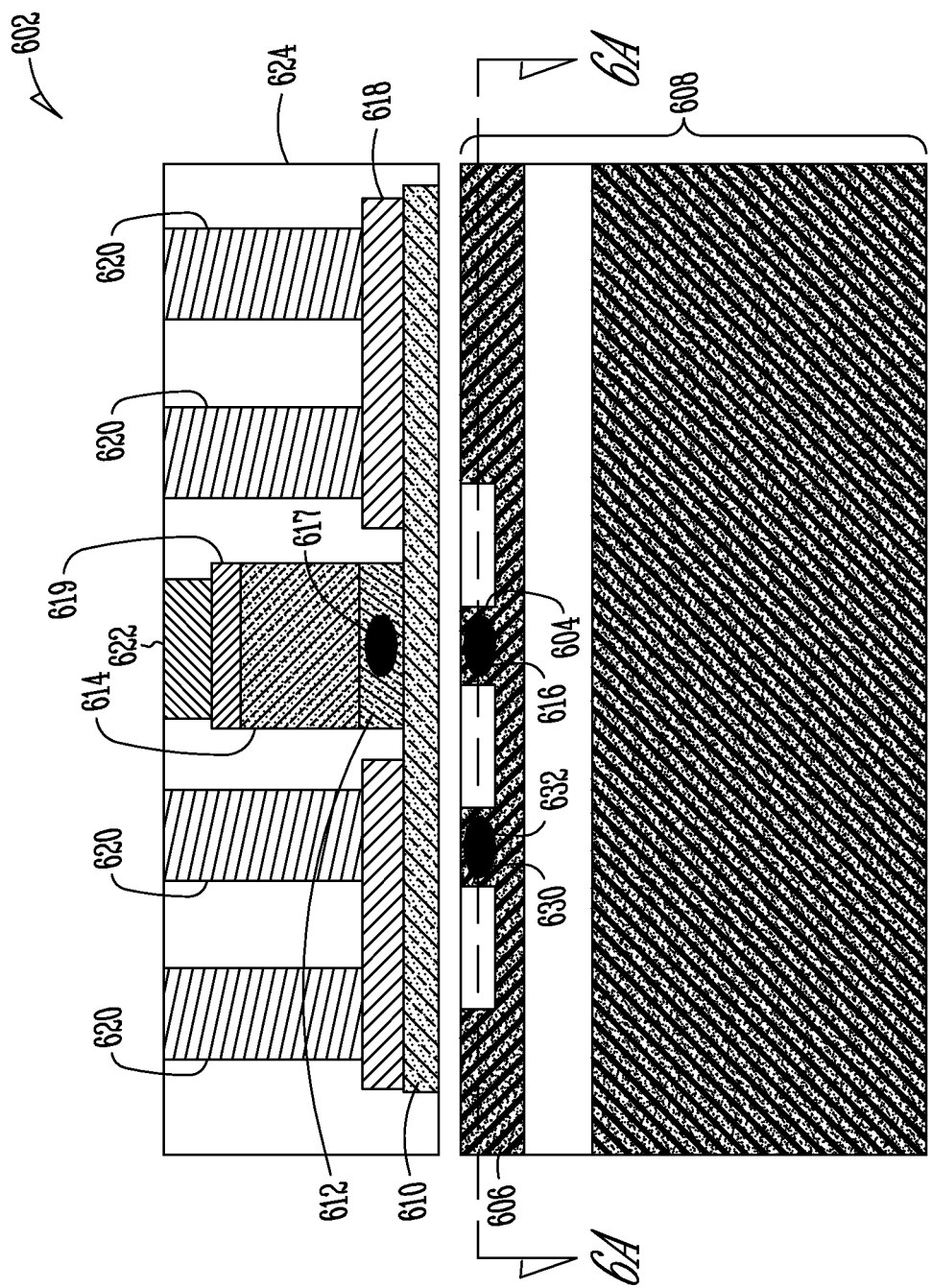

FIGS. 6A and 6B are cross-sectional top and side views, respectively, of a Bragg-grating-based optical temperature sensor 600 placed adjacent an active compound semiconductor photonic device 602 of a PIC, in accordance with various embodiments. The active device 602 may be, for instance, a laser, modulator, or photodetector (e.g., on a transceiver PIC). It includes a diode structure of III-V (or other compound semiconductor) material formed above, and optically coupled to, a silicon waveguide 604 formed in the silicon device layer 606 of an SOI substrate 608. As shown in FIG. 6B, the diode structure may include, e.g., an n-type bottom layer 610 and, disposed above the n-type bottom layer 610, a diode mesa including an intrinsic, or active, layer 612 and a p-type top layer 614. In use, light guided in the silicon waveguide 604 couples vertically into the active layer 612 (as indicated by optical modes 616, 617). To enable application of a voltage or current to the diode structure, the device 602 includes electrical connections to the n-type bottom and p-type top layers 610, 614. The electrical connections include a contact metal layer 618 disposed on top of the n-type bottom layer 610 (e.g., to both sides or surrounding the diode mesa), a p-type contact metal layer 619 is disposed on top of the p-type top layer 614, and vertical vias 620, 622 electrically connecting the n-type and p-type contact metal layers 618, 619 to electrical terminals of driver circuitry. The diode structure is enclosed in a dielectric cladding 624.

The temperature sensor 600 is a Bragg grating formed by periodic refractive-index variations in a second silicon waveguide 630. Light propagating in that second silicon waveguide 630 experiences a strong reflection at a wavelength twice the grating period multiplied by the effective refractive index. Since the grating period varies slightly with temperature due to thermal expansion or contraction, the wavelength at which the reflection peaks is a good indicator of the sensor temperature. As shown in FIG. 6A, the second silicon waveguide 630 may run parallel to the first silicon waveguide (604, which is coupled to the active photonic device 602), and underneath the n-type bottom layer 610 of the diode structure of the active device 602. Thus, light guided in the second silicon waveguide 630 and reflected in the Bragg grating, indicated by optical mode 632, comes very close to the active region 612 of the photonic device.

Figure 7:
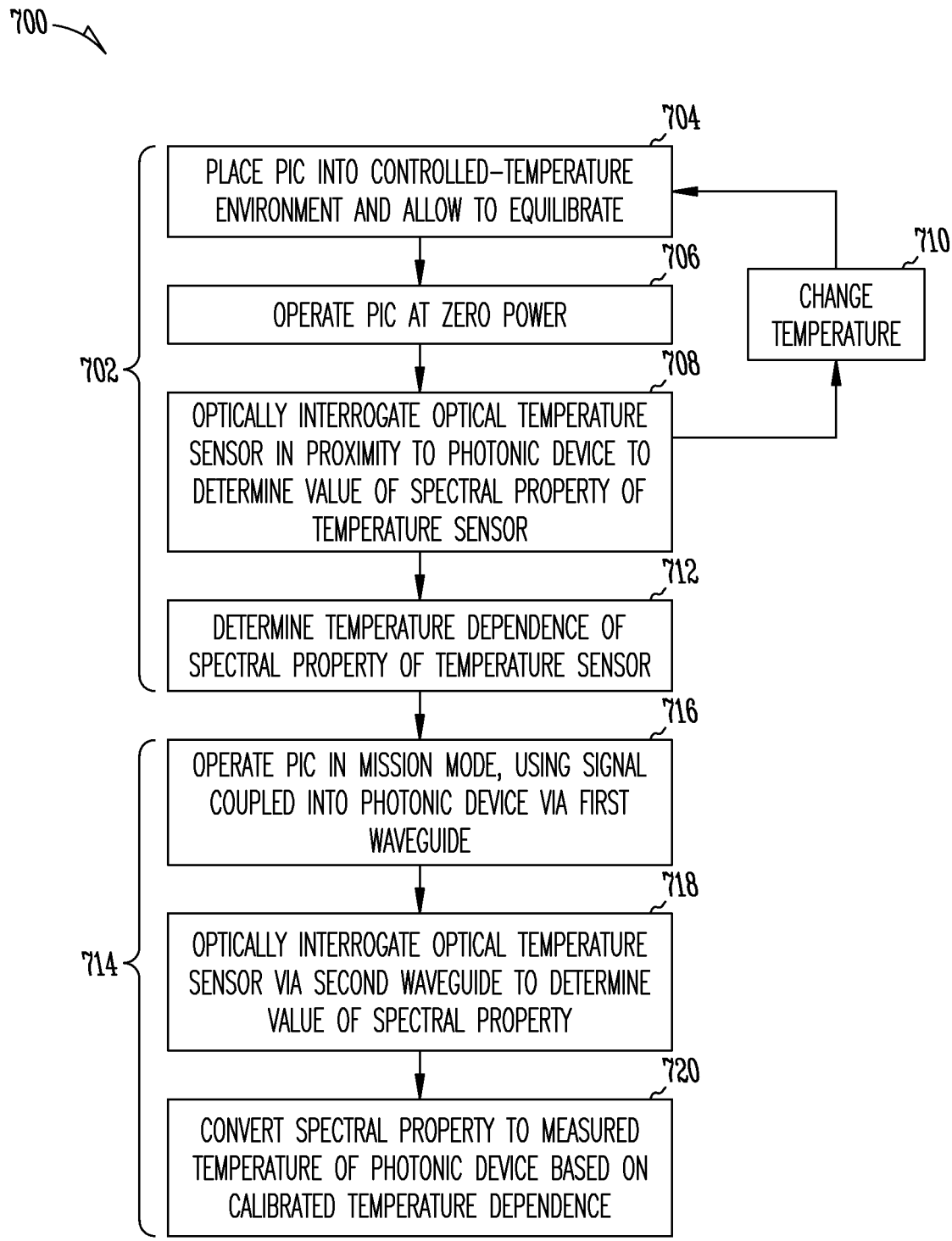
FIG. 7 is a flow chart of a method of calibrating and using a dedicated optical temperature sensor without mission-mode function for temperature measurements of a photonic device, in accordance with various embodiments.

FIG. 7 is a flow chart of a method 700 of calibrating and using a dedicated optical temperature sensor without mission-mode function for temperature measurements of a photonic device, in accordance with various embodiments. The temperature sensor and photonic device may, for instance, correspond to the sensor 502 adjacent laser 506, or to the sensor 504 adjacent optical modulator 508, of the photonic transceiver 500 of FIG. 5. During a calibration phase 702, the PIC (e.g., implementing photonic transceiver 500) is placed into a controlled-temperature environment (such as, e.g., an oven) set to an initial temperature, and allowed to substantially thermally equilibrate (act 704), such that the temperature sensor(s) and photonic device(s) all reach the set temperature (within acceptable margins). If an external laser (e.g., 510) and photodetector (e.g., 528) are used for the calibration, the power to the PIC is set to zero, (act 706). (Otherwise, if an integrated photodetector is being used, the PIC is operated in low-power mode.) The optical temperature sensor is interrogated (act 708), e.g., by coupling light from the external laser into the optical waveguide associated with the sensor and measuring the reflected or transmitted portion of the light with the external (or integrated) photodetector. In some embodiments, the wavelength of the external laser is stepped over a wavelength range, e.g., including one or more FSRs of the optical temperature sensor, and the wavelength at the null (e.g., for an AMZI or all-pass ring implementing the temperature sensor) and/or peak (e.g., for a Bragg reflector or add-drop ring) of the measured spectral response are recorded.

The controlled-temperature environment is then changed to a second temperature (act 710), the PIC is allowed to thermally equilibrate at the second temperature (act 704), and the interrogation of the optical temperature sensor to measure the spectral property is repeated at the second temperature (act 708). Optionally, the spectral property is measured at one or more additional temperatures, depending on the desired accuracy of the thermal characterization, as well as cost and time considerations. The determined values of the spectral property at two or more temperatures are then used to determine the temperature dependence of the spectral property over a continuous range of temperatures, which may involve interpolating between and/or extrapolating beyond the temperatures at which the measurements were performed (act 712). For example, based on measurements of the reflection peak wavelengths $\lambda_1$ and $\lambda_2$ at two respective temperatures $T_1$ and $T_2$, the temperature-dependent wavelength shift can be calculated as $d\lambda/dT=(\lambda_2-\lambda_1)/(T_2-T_1)$. The determined temperature dependence is stored in memory (e.g., of an EIC associated with the PIC or an external memory) for later use.

Upon calibration of the temperature sensor, the sensor can be used, in conjunction with the calibration data, to measure the temperature of the adjacent photonic device as part of characterizing the mission-mode thermal performance of the PIC in phase 714. The PIC is now operated in mission mode, that is, powered on as in mission mode (which is generally a high-power mode), and with a mission-mode optical signal, e.g., from an internal PIC laser (such as a transceiver laser), coupled into the photonic device via an associated first waveguide (act 716). Simultaneously, the temperature sensor is interrogated via its associated waveguide (which is separate from the waveguide of the phonic device to be monitored) with an interrogation signal coupled into the PIC, e.g., by an external laser (act 718). Using the stored, calibrated temperature dependence of the spectral property of the optical temperature sensor, the measured spectral property can then be converted to a temperature of the temperature sensor and, by extension due to its proximity, the photonic device (act 720). For example, a measured reflection peak wavelength can be converted into the temperature of the temperature sensor and photonic device according to: $T=T_1+(\lambda-\lambda_1)/(d\lambda/dT)$.

The following numbered examples further define various illustrative embodiments.

1. A photonic integrated circuit (PIC) comprising: a first optical waveguide in a device layer of a substrate; an active photonic device coupled to the first optical waveguide, the active photonic device comprising a diode junction; and a second optical waveguide in the device layer of the substrate, the second optical waveguide comprising an optical temperature sensor in sensing proximity to the diode junction.

2. The photonic integrated circuit of example 1, wherein the optical temperature sensor comprises at least one of a Bragg grating, a ring resonator, or an asymmetric Mach-Zehnder interferometer.

3. The photonic integrated circuit of example 1 or example 2, wherein the active photonic device comprises a compound semiconductor diode structure disposed above the first optical waveguide and comprising the diode junction, and electrical connections for applying a voltage across the diode structure.

4. The photonic integrated circuit of any of examples 1-3, wherein the active photonic device is one of a laser, an optical modulator, a wavelength-reference optical filter, or an optical multiplexer/demultiplexer.

5. The photonic integrated circuit of any of examples 1-4, wherein the active photonic device comprises at least one of a symmetric or asymmetric Mach-Zehnder interferometer, an arrayed waveguide grating, or an electro-ab sorption modulator.

6. A method for measuring a temperature of a photonic device in a photonic integrated circuit (PIC), the method comprising: coupling light into the photonic device via a first optical waveguide; optically interrogating an optical temperature sensor placed in sensing proximity to the photonic device via a second optical waveguide to determine a spectral property of the optical temperature sensor; and computationally converting the determined spectral property to the measured temperature based on a calibrated temperature dependence of the spectral property.

7. The method of example 6, wherein optically interrogating the optical temperature sensor comprises coupling light into the second optical waveguide using a laser external to the PIC and measuring at least one of light reflected in the optical temperature sensor or light transmitted by the optical temperature sensor using an external photodetector.

8. The method of example 7, wherein optically interrogating the optical temperature sensor comprises tuning a wavelength of the external laser over a wavelength range and measuring the reflected or transmitted light over the wavelength range.

9. The method of any of examples 6-8, further comprising calibrating the temperature dependence of the spectral property by: placing the PIC into a controlled-temperature environment at a first temperature; following substantial thermal equilibration at the first temperature, optically interrogating the optical temperature sensor via the second optical waveguide to determine a first value of the spectral property; placing the PIC into a controlled-temperature environment at a second temperature; following substantial thermal equilibration at the second temperature, optically interrogating the optical temperature sensor via the second optical waveguide to determine a second value of the spectral property; and determining the temperature dependence of the spectral property based at least in part on the first and second values and the first and second temperatures.

10. The method of example 9, wherein determining the temperature dependence of the spectral property comprises at least one of interpolating the spectral property between the first and second temperatures or extrapolating the spectral property beyond the first or second temperature.

11. The method of example 9 or example 10, wherein calibrating the temperature dependence further comprises: placing the PIC into a controlled-temperature environment at a third temperature; and following substantial thermal equilibration at the third temperature, optically interrogating the optical temperature sensor via the second optical waveguide to determine a third value of the spectral property, wherein the temperature dependence is further based on the third value and the third temperature.

12. The method of any of examples 9-11, wherein the photonic device is an active photonic device comprising a diode structure and electrical connections to apply a voltage across the diode structure, wherein power to the diode structure is off during calibration of the temperature dependence and on to measure the temperature of the photonic device based on the calibrated temperature dependence.

13. A method for measuring a temperature of a photonic device in a photonic integrated circuit (PIC), the method comprising: coupling a first optical signal into the photonic device in a first direction of propagation; using a second optical signal coupled into the photonic device in a second direction of propagation opposite the first direction of propagation, optically interrogating the photonic device to determine a spectral property of the photonic device; and computationally converting the determined spectral property to the measured temperature based on a calibrated temperature dependence of the spectral property.

14. The method of example 13, wherein the first optical signal is generated by a laser of the PIC and the second optical signal is generated by a laser external to the PIC.

15. The method of example 13 or example 14, wherein optically interrogating the photonic device comprises measuring an optical power of a transmitted portion of the second optical signal or of a reflected portion of the second optical signal.

16. The method of example 15, wherein optically interrogating the photonic device comprises measuring the optical power of the transmitted portion of the second optical signal using an optical tap and monitor photodiode at an output, in the second direction of propagation, of the photonic device.

17. The method of example 15, wherein optically interrogating the photonic device comprises measuring the optical power of the transmitted portion of the second optical signal using a second photonic device of the PIC at an output, in the second direction of propagation, of the photonic device, the second photonic device being operable as a photodetector as well as having a separate mission mode function.

18. The method of example 17, wherein the photonic device is a multiplexer/demultiplexer and the second photonic device is an electro-absorption modulator.

19. The method of any of examples 15-18, wherein the second optical signal is tuned over a range of wavelengths and the optical power of the reflected or transmitted portion of the second optical signal is measured over the range of wavelengths.

20. The method of example 19, wherein the photonic device is an optical filter, and wherein the range of wavelengths comprises at least a free spectral range of the optical filter.

21. The method of example 20, wherein the spectral property comprises a null or peak of the optical filter.

22. The method of any of examples 13-21, further comprising calibrating the temperature dependence of the spectral property by: placing the PIC into a controlled-temperature environment at a first temperature; following substantial thermal equilibration at the first temperature, optically interrogating the photonic device, using an optical signal coupled into the photonic device in a the second direction of propagation, to determine a first value of the spectral property of the photonic device; placing the PIC into a controlled-temperature environment at a second temperature; following substantial thermal equilibration at the second temperature, optically interrogating the photonic device, using an optical signal coupled into the photonic device in a the second direction of propagation, to determine a second value of the spectral property of the photonic device; and determining the temperature dependence of the spectral property based at least in part on the first and second values and the first and second temperatures.

23. The method of example 22, wherein the photonic device is an optical filter, wherein the photonic device is interrogated over a range of wavelengths comprising at least one free spectral range of the optical filter, and wherein a spectral shift associated with the spectral property between the first and second temperatures is less than the free spectral range.

24. The method of example 22 or example 23, wherein determining the temperature dependence of the spectral property comprises interpolating the spectral property between the first and second temperatures or extrapolating the spectral property beyond the first or second temperature.

25. The method of any of examples 22-24, wherein calibrating the temperature dependence further comprises: placing the PIC into a controlled-temperature environment at a third temperature; and following substantial thermal equilibration at the third temperature, optically interrogating the photonic device, using an optical signal coupled into the photonic device in a the second direction of propagation, to determine a third value of the spectral property of the photonic device; and wherein the temperature dependence is further based on the third value and the third temperature.

26. The method of any of examples 22-25, further comprising storing the temperature dependence of the spectral property in memory associated with the PIC.

27. The method of any of examples 22-26, wherein the PIC is operated in low-power mode during calibration.

Although the inventive subject matter has been described with reference to specific example embodiments, it will be evident that various modifications and changes may be made to these embodiments without departing from the broader scope of the inventive subject matter. Accordingly, the specification and drawings are to be regarded in an illustrative rather than a restrictive sense.

The invention claimed is:

1. A photonic integrated circuit (PIC) comprising:
a first optical waveguide in a device layer of a substrate;
an active photonic device coupled to the first optical waveguide, the active photonic device comprising a diode junction; and
a second optical waveguide in the device layer of the substrate, the second optical waveguide comprising an optical temperature sensor in sensing proximity to the diode junction.

2. The photonic integrated circuit of claim 1, wherein the optical temperature sensor comprises at least one of a Bragg grating, a ring resonator, or an asymmetric Mach-Zehnder interferometer.

3. The photonic integrated circuit of claim 1, wherein the active photonic device is one of a laser, an optical modulator, a wavelength-reference optical filter, or an optical multiplexer/demultiplexer.

4. The photonic integrated circuit of claim 1, wherein the active photonic device comprises at least one of a symmetric or asymmetric Mach-Zehnder interferometer, an arrayed waveguide grating, or an electro-ab sorption modulator.

5. A method for measuring a temperature of a photonic device in a photonic integrated circuit (PIC), the method comprising:
coupling light into the photonic device via a first optical waveguide;
optically interrogating an optical temperature sensor placed in sensing proximity to the photonic device via a second optical waveguide to determine a spectral property of the optical temperature sensor; and
computationally converting the determined spectral property to the measured temperature based on a calibrated temperature dependence of the spectral property.

6. The method of claim 5, wherein optically interrogating the optical temperature sensor comprises coupling light into the second optical waveguide using a laser external to the PIC and measuring at least one of light reflected in the optical temperature sensor or light transmitted by the optical temperature sensor using an external photodetector.

7. The method of claim 6, wherein optically interrogating the optical temperature sensor comprises tuning a wavelength of the external laser over a wavelength range and measuring the reflected or transmitted light over the wavelength range.

8. The method of claim 7, further comprising calibrating the temperature dependence of the spectral property by:
placing the PIC into a controlled-temperature environment at a first temperature;
following substantial thermal equilibration at the first temperature, optically interrogating the optical temperature sensor via the second optical waveguide to determine a first value of the spectral property;
placing the PIC into a controlled-temperature environment at a second temperature;
following substantial thermal equilibration at the second temperature, optically interrogating the optical temperature sensor via the second optical waveguide to determine a second value of the spectral property; and
determining the temperature dependence of the spectral property based at least in part on the first and second values and the first and second temperatures.

9. The method of claim 6, wherein the photonic device is an active photonic device comprising a diode structure and electrical connections to apply a voltage across the diode structure, wherein power to the diode structure is off during calibration of the temperature dependence and on to measure the temperature of the photonic device based on the calibrated temperature dependence.

10. A method for measuring a temperature of a photonic device in a photonic integrated circuit (PIC), the method comprising:
coupling a first optical signal into the photonic device in a first direction of propagation;
using a second optical signal coupled into the photonic device in a second direction of propagation opposite the first direction of propagation, optically interrogating the photonic device to determine a spectral property of the photonic device; and
computationally converting the determined spectral property to the measured temperature based on a calibrated temperature dependence of the spectral property.

11. The method of claim 10, wherein the first optical signal is generated by a laser of the PIC and the second optical signal is generated by a laser external to the PIC.

12. The method of claim 10, wherein optically interrogating the photonic device comprises measuring an optical power of a transmitted portion of the second optical signal or of a reflected portion of the second optical signal.

13. The method of claim 12, wherein optically interrogating the photonic device comprises measuring the optical power of the transmitted portion of the second optical signal using an optical tap and monitor photodiode at an output, in the second direction of propagation, of the photonic device.

14. The method of claim 12, wherein optically interrogating the photonic device comprises measuring the optical power of the transmitted portion of the second optical signal using a second photonic device of the PIC at an output, in the second direction of propagation, of the photonic device, the second photonic device being operable as a photodetector as well as having a separate mission mode function.

15. The method of claim 12, wherein the second optical signal is tuned over a range of wavelengths and the optical power of the reflected or transmitted portion of the second optical signal is measured over the range of wavelengths.

16. The method of claim 15, wherein the photonic device is an optical filter, and wherein the range of wavelengths comprises at least a free spectral range of the optical filter.

17. The method of claim 10, further comprising calibrating the temperature dependence of the spectral property by:
placing the PIC into a controlled-temperature environment at a first temperature;
following substantial thermal equilibration at the first temperature, optically interrogating the photonic device, using an optical signal coupled into the photonic device in a the second direction of propagation, to determine a first value of the spectral property of the photonic device;
placing the PIC into a controlled-temperature environment at a second temperature;
following substantial thermal equilibration at the second temperature, optically interrogating the photonic device, using an optical signal coupled into the photonic device in a the second direction of propagation, to determine a second value of the spectral property of the photonic device; and
determining the temperature dependence of the spectral property based at least in part on the first and second values and the first and second temperatures.

18. The method of claim 17, wherein the photonic device is an optical filter, wherein the photonic device is interrogated over a range of wavelengths comprising at least one free spectral range of the optical filter, and wherein a spectral shift associated with the spectral property between the first and second temperatures is less than the free spectral range.

19. The method of claim 17, further comprising storing the temperature dependence of the spectral property in memory associated with the PIC.

20. The method of claim 17, wherein the PIC is operated in low-power mode during calibration.

* * * * *